(12) United States Patent
Kitagawa

(10) Patent No.: US 7,094,067 B2
(45) Date of Patent: Aug. 22, 2006

(54) CONNECTION STRUCTURE BETWEEN PRINTED CIRCUIT BOARD AND FLEXIBLE CIRCUIT BOARD

(75) Inventor: Tsuyoshi Kitagawa, Yao (JP)

(73) Assignee: Hosiden Corporation, Yao (JP)

( * ) Notice: Subject to any disclaimer, the term of this patent is extended or adjusted under 35 U.S.C. 154(b) by 372 days.

(21) Appl. No.: 10/679,296

(22) Filed: Oct. 7, 2003

(65) Prior Publication Data

US 2004/0074670 A1   Apr. 22, 2004

(30) Foreign Application Priority Data

Oct. 21, 2002   (JP)   ............................ 2002-306155

(51) Int. Cl.
*H01R 12/00* (2006.01)
*H01R 12/24* (2006.01)
(52) U.S. Cl. ........................................ 439/67; 439/493
(58) Field of Classification Search ................ 174/254; 361/803; 439/66, 67, 493
See application file for complete search history.

(56) References Cited

U.S. PATENT DOCUMENTS

| 2,352,454 | A |   | 6/1944  | Schellenger et al. ........ 248/361 |
| 3,500,289 | A |   | 3/1970  | Herb ........................... 339/17 |
| 4,832,609 | A |   | 5/1989  | Chung ........................ 439/67 |
| 5,009,607 | A | * | 4/1991  | Gordon et al. ................ 439/67 |
| 5,160,269 | A | * | 11/1992 | Fox et al. .................... 439/67 |
| 5,295,838 | A | * | 3/1994  | Walen et al. ................. 439/67 |
| 5,306,162 | A |   | 4/1994  | Armendariz ................. 439/67 |
| 5,795,162 | A | * | 8/1998  | Lambert ....................... 439/63 |
| 6,077,090 | A | * | 6/2000  | Campbell et al. ............. 439/67 |
| 6,739,878 | B1 | * | 5/2004  | Balzano ....................... 439/67 |
| 6,869,291 | B1 | * | 3/2005  | Norland et al. ............... 439/67 |

FOREIGN PATENT DOCUMENTS

| DE | 40 34 690 A1   | 11/1991 |
| DE | 100 28 561 A1  | 12/2001 |
| EP | 0 073 528 A2   | 3/1983  |
| FR | 2354018        | 12/1977 |
| JP | 10-074566      | 3/1988  |
| JP | 64-9376        | 1/1989  |
| JP | 04-36779       | 3/1992  |

OTHER PUBLICATIONS

Copy of European Search Report dated Aug. 11, 2005, 4 pages.
David Maddick: "Advantages of going SNAP," *Electronics Weekly*, No. 1273, Jun. 26, 1985, 2 pages.

* cited by examiner

*Primary Examiner*—Hung V. Ngo
(74) *Attorney, Agent, or Firm*—Armstrong, Kratz, Quintos, Hanson & Brooks, LLP

(57) ABSTRACT

The present invention provides a connection structure between a printed circuit board and a flexible circuit board that enables the number of assembly steps including steps using soldering to be reduced and enables detachment of the flexible circuit board to be prevented. Printed-side conductive patterns formed on a printed circuit board is connected with flexible-side conductive patterns formed on a flexible circuit board. The connection structure comprises: two printed-side openings provided in the printed-side conductive patterns of the printed circuit board; two flexible-side openings provided in the flexible circuit board to align with the printed-side openings when the flexible-side conductive patterns are brought into contact with the printed-side conductive patterns; a frame having two leg parts that are inserted through the both openings; and an elastic pressing member interposed between the frame and the flexible circuit board. The leg parts are fixed on a bottom surface of the printed circuit board.

13 Claims, 7 Drawing Sheets

(A)

(B)

(C)

(D)

CONNECTION STRUCTURE BETWEEN PRINTED CIRCUIT BOARD AND FLEXIBLE CIRCUIT BOARD

BACKGROUND OF THE INVENTION

1. Field of the Invention

The present invention relates to a connection structure between a printed circuit board and a flexible circuit board, the connection structure connecting printed-side conductive patterns formed on the printed circuit board with flexible-side conductive patterns formed on the flexible circuit board.

2. Description of the Related Art

Japanese Unexamined Utility Model Publication No. 64-9376 (Patent Literature 1) discloses a connector used for connecting printed-side conductive patterns formed on a printed circuit board with flexible-side conductive patterns formed on a flexible circuit board in an electronic device.

The connector is mounted on the printed circuit board and has a connector housing made of an insulating material and terminal pieces that are built in the connector housing and are brought into contact with the printed-side conductive patterns formed on the surface of the printed circuit board when the connector is mounted on the printed circuit board. The flexible circuit board is inserted from a cable guiding window provided in the connector housing, and the flexible-side conductive patterns formed on the flexible circuit board are electrically brought into contact with the terminal pieces.

Other connectors having no component corresponding to the above connector housing are disclosed in Japanese Unexamined Patent Publication No. 10-74566 (Patent Literature 2) and Japanese Unexamined Utility Model Publication No. 04-36779 (Patent Literature 3).

The connector disclosed in Patent Literature 2 has: an elastic pressing member made of an elastic material and used as a press-bonded connection part located between a flexible circuit board and a printed circuit board; a retaining member for elastically deforming the elastic pressing member to exert a pressing force on the press-bonded connection part; and screws for fixing the retaining member to the printed circuit board.

The connector disclosed in Patent Literature 3 has: a connection cover member that is rotatably supported by a printed circuit board and that is attachable to and detachable from flexible-side conductive patterns of a flexible circuit board; an elastic pressing member positioned between the connection cover member and the printed circuit board; and fixation means for fixing the connection cover member to the printed circuit board in the state where the connection cover member is rotated in a direction to printed-side conductive patterns of the printed circuit board.

Patent Literature 1

Japanese Unexamined Utility Model Publication No. 64-9376 (pp. 1, FIG. 11)

Patent Literature 2

Japanese Unexamined Patent Publication No. 10-74566 (pp. 2, FIG. 1)

Patent Literature 3

Japanese Unexamined Utility Model Publication No. 04-36779 (pp. 1, FIG. 1)

However, in the connector disclosed in Patent Literature 1, soldering is employed in the step of mounting the connector to the printed circuit board. Additionally, there is required a step of inserting the flexible circuit board into the connector mounted on the printed circuit board.

In the connector disclosed in Patent Literature 2, there is required a screwing step of fixing the retaining member to the printed circuit board.

In the connector disclosed in Patent Literature 3, when the flexible circuit board is pulled downward, the flexible circuit board is likely to be detached.

SUMMARY OF THE INVENTION

The present invention made under the above circumstances, and an object thereof is to provide a connection structure between a printed circuit board and a flexible circuit board that enables the number of assembly steps including steps using soldering to be reduced and enables detachment of the flexible circuit board to be prevented.

According to the present invention, there is provided a connection structure between a printed circuit board and a flexible circuit board, for connecting printed-side conductive patterns formed on a printed circuit board with flexible-side conductive patterns formed on a flexible circuit board, the connection structure comprising: two or more printed-side openings provided around the printed-side conductive patterns of the printed circuit board; two or more flexible-side openings provided in the flexible circuit board to align with the printed-side openings when the flexible-side conductive patterns are brought into contact with the printed-side conductive patterns; a frame having two or more leg parts that are inserted through the both openings; and an insulative elastic pressing member interposed between the frame and the flexible circuit board, wherein the leg parts are fixed on a bottom surface of the printed circuit board.

BRIEF DESCRIPTION OF THE DRAWINGS

FIGS. 5A to 5D illustrate a frame used in the connection structure between a printed circuit board and a flexible circuit board according to the first embodiment of the present invention, wherein FIG. 5A is a schematic plan view, FIG. 5B is a cross-sectional view taken along line A—A of FIG. 5A, FIG. 5C is a cross-sectional view taken along line B—B of FIG. 5B, and FIG. 5D is a schematic side view;

DESCRIPTION OF THE PREFERRED EMBODIMENTS

Figure 1:
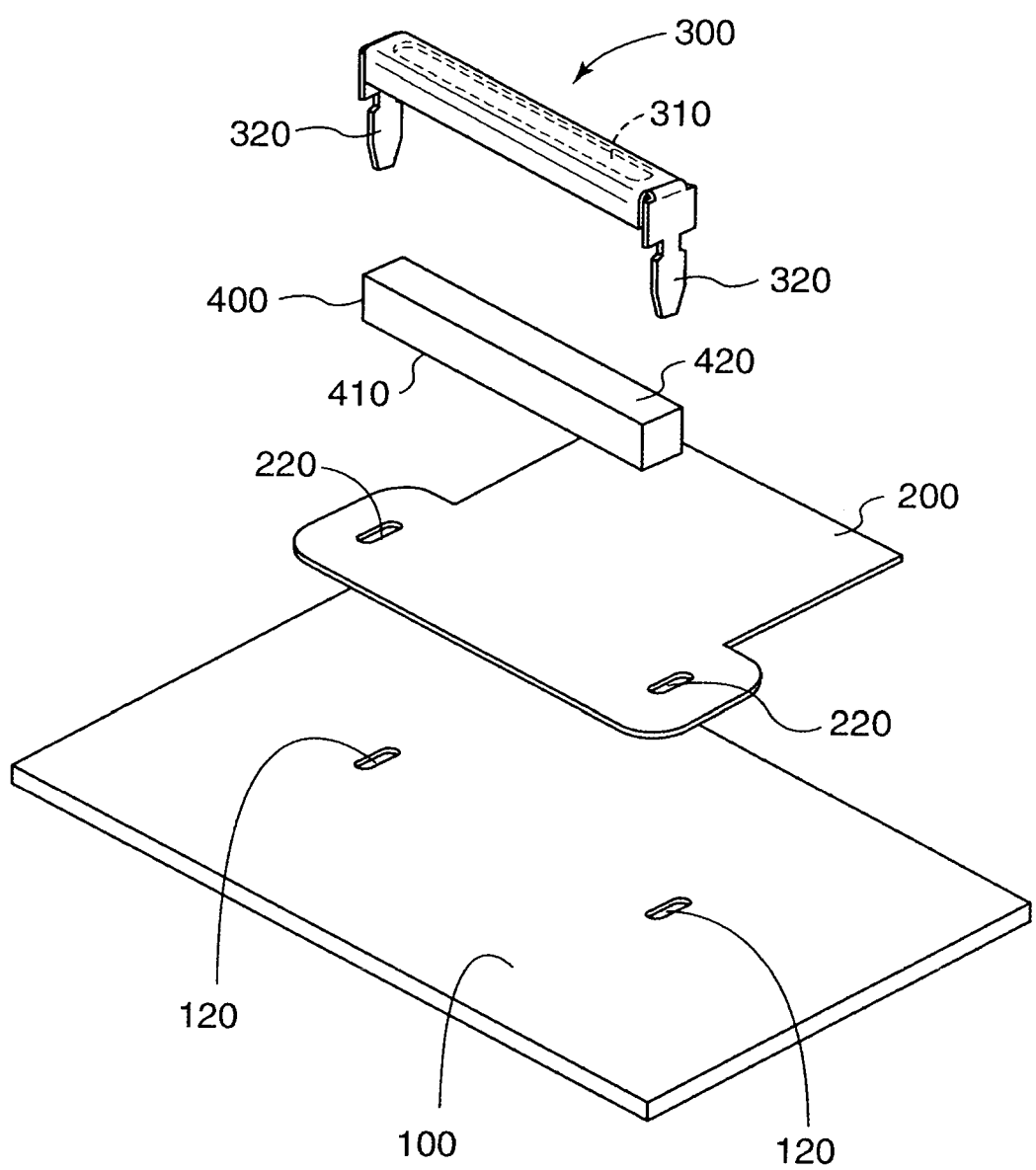
FIG. 1 is an exploded perspective view schematically showing a connection structure between a printed circuit board and a flexible circuit board according to a first embodiment of the present invention.
Figure 2:
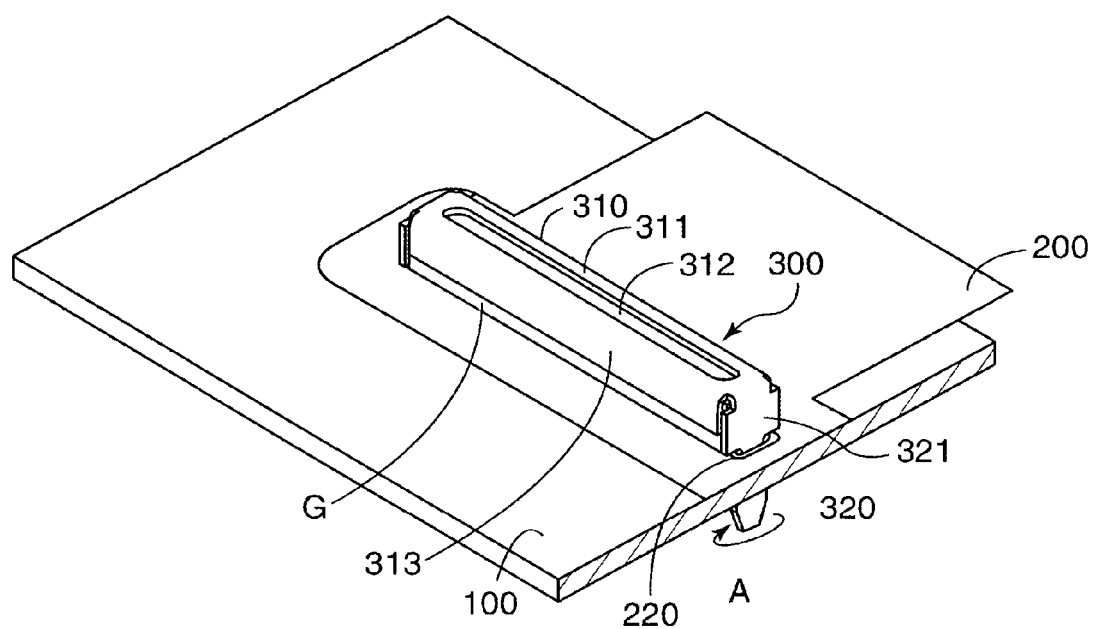
FIG. 2 is a partially fractured perspective view schematically showing the connection structure between a printed circuit board and a flexible circuit board according to the first embodiment of the present invention.
Figure 3:
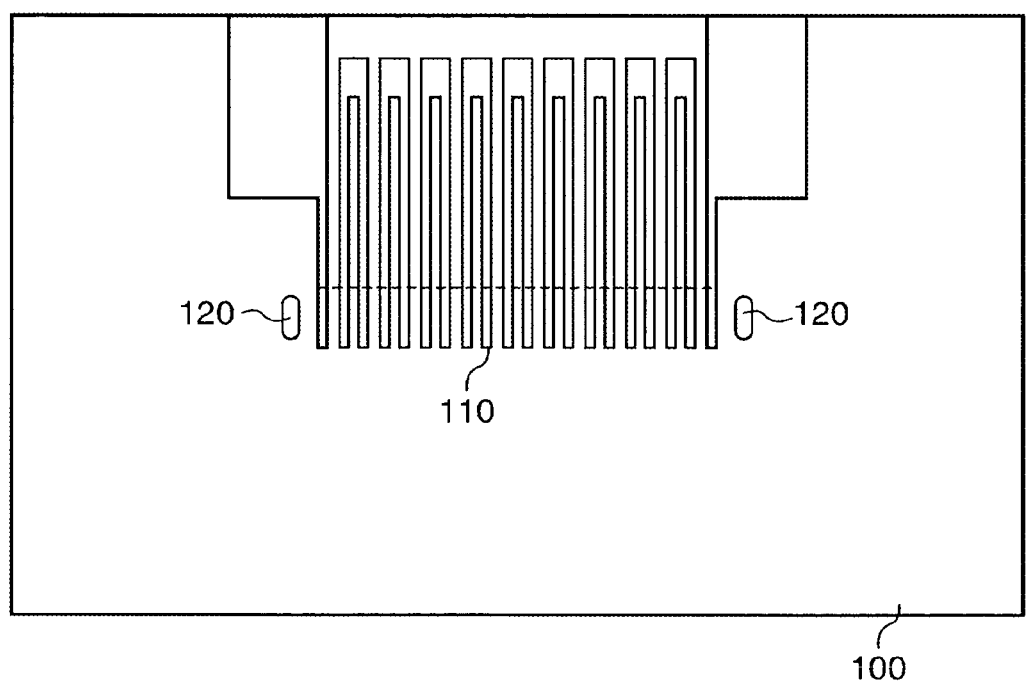
FIG. 3 is a plan view schematically showing printed-side conductive patterns of the printed circuit board that are to be connected by the connection structure between a printed circuit board and a flexible circuit board according to the first embodiment of the present invention.
Figure 4:
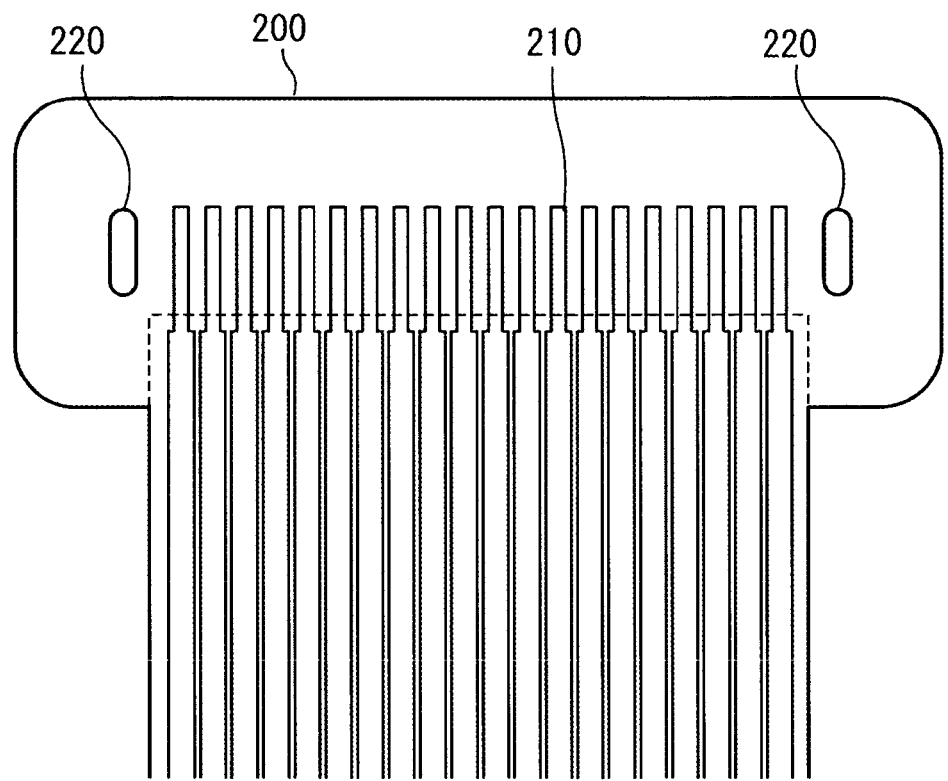
FIG. 4 is a bottom view schematically showing flexible-side conductive patterns of the flexible circuit board that are to be connected by the connection structure between a printed circuit board and a flexible circuit board according to the first embodiment of the present invention.
Figure 6:
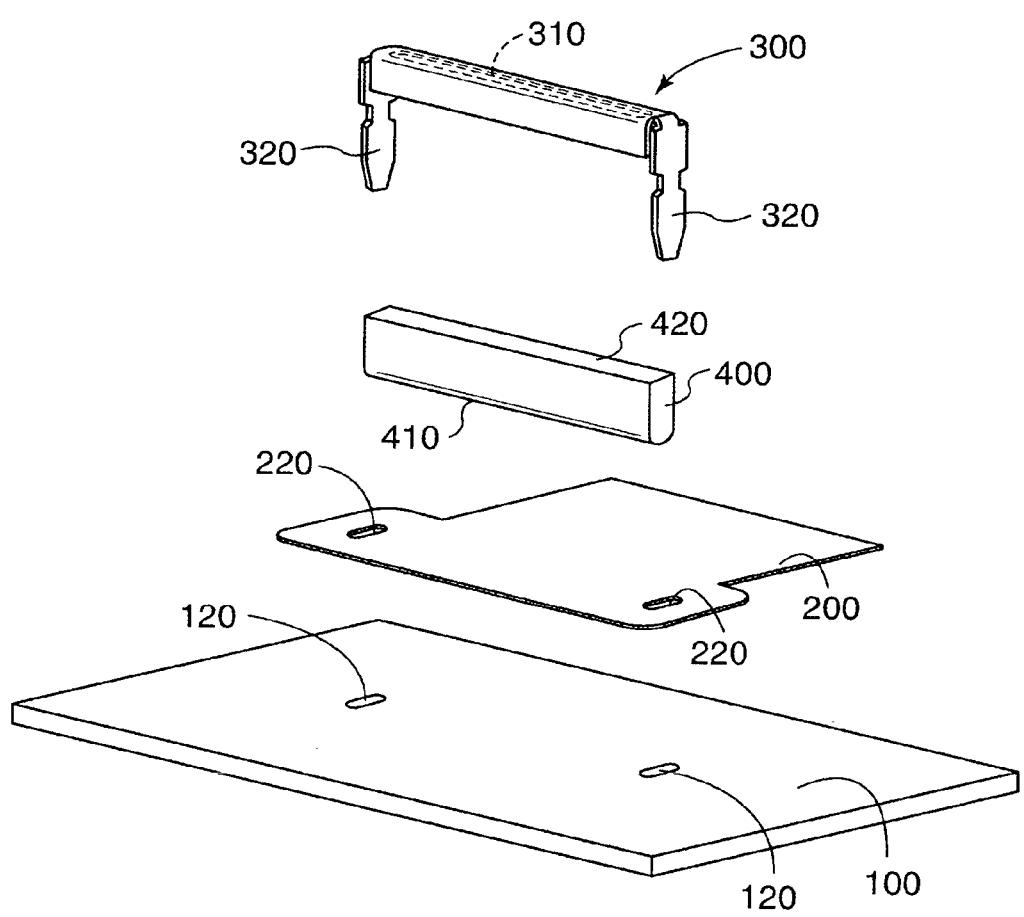
FIG. 6 is an exploded perspective view schematically showing a connection structure between a printed circuit board and a flexible circuit board according to a second embodiment of the present invention.
Figure 7:
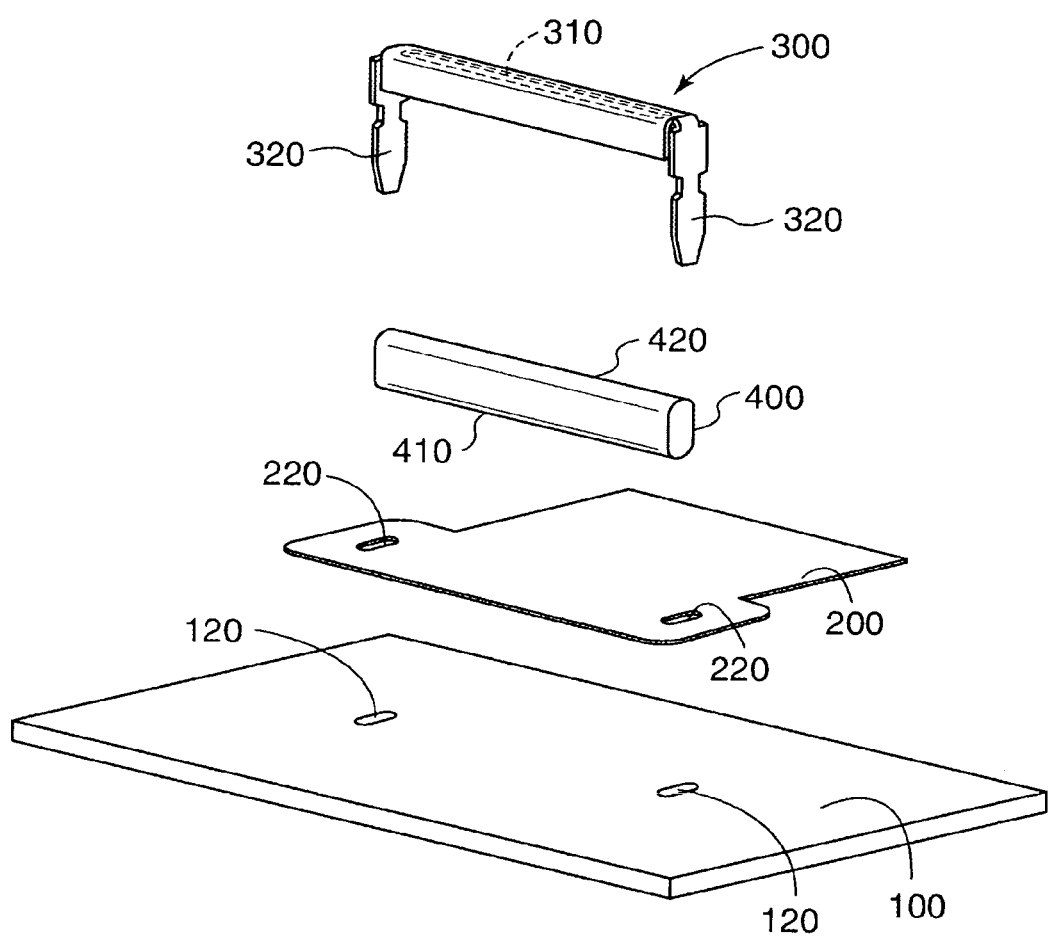
FIG. 7 is an exploded perspective view schematically showing a connection structure between a printed circuit board and a flexible circuit board according to a third embodiment of the present invention.

FIG. 1 is an exploded perspective view schematically showing a connection structure between a printed circuit board and a flexible circuit board according to a first embodiment of the present invention. FIG. 2 is a partially fractured perspective view schematically showing the connection structure between a printed circuit board and a flexible circuit board according to the first embodiment of the present invention. FIG. 3 is a plan view schematically showing printed-side conductive patterns of the printed circuit board that are to be connected by the connection structure between a printed circuit board and a flexible circuit board according to the first embodiment of the present invention. FIG. 4 is a bottom view schematically showing flexible-side conductive patterns of the flexible circuit board that are to be connected by the connection structure between a printed circuit board and a flexible circuit board according to the first embodiment of the present invention. FIGS. 5A to 5D illustrate a frame used in the connection structure between a printed circuit board and a flexible circuit board according to the first embodiment of the present invention, wherein FIG. 5A is a schematic plan view, FIG. 5B is a cross-sectional view taken along line A—A of FIG. 5A, FIG. 5C is a cross-sectional view taken along line B—B of FIG. 5B, and FIG. 5D is a schematic side view. FIG. 6 is an exploded perspective view schematically showing a connection structure between a printed circuit board and a flexible circuit board according to a second embodiment of the present invention. FIG. 7 is an exploded perspective view schematically showing a connection structure between a printed circuit board and a flexible circuit board according to a third embodiment of the present invention.

According to the first embodiment of the present invention, there is provided a connection structure between a printed circuit board and a flexible circuit board, for connecting printed-side conductive patterns 110 formed on a printed circuit board 100 with flexible-side conductive patterns 210 formed on a flexible circuit board 200, the connection structure comprising: two printed-side openings 120 provided around the printed-side conductive patterns 110 of the printed circuit board 100; two flexible-side openings 220 provided in the flexible circuit board 200 to align with the printed-side openings 120 when the flexible-side conductive patterns 210 are brought into contact with the printed-side conductive patterns 110; a frame 300 having two leg parts 320 that are inserted through the both openings 120 and 220; and an elastic pressing member 400 interposed between the frame 300 and the flexible circuit board 200, wherein the leg parts 320 are fixed on a bottom surface of the printed circuit board 100.

As shown in FIG. 3, the plurality of parallel printed-side conductive patterns 110 are formed inwardly from an end portion of the printed circuit board 100. The printed-side conductive patterns 110 are connected to an electronic component (not shown) mounted on the printed circuit board 100. Two lengthy printed-side openings 120 in total are provided at the left and right on the base end side of the printed-side conductive patterns 110. The printed-side conductive patterns 110 are formed of a copper foil, so that the patterns are easily oxidized when exposed to the air. In addition, since the patterns are low in contact reliability, they subjected to an oxidation prevention treatment such as gold plating, silver paste printing or carbon printing.

As shown in FIG. 4, in the flexible circuit board 200, an end portion is formed larger than other portions, and the plurality of parallel flexible-side conductive patterns 210 are formed inwardly from the end portion. The flexible-side conductive patterns 210 are connected to an electronic component (not shown) mounted on the flexible circuit board 200. Two lengthy flexible-side openings 220 in total are formed at the left and right on the base end side of the flexible-side patterns 210. The flexible-side conductive openings 220 are each formed to the same size and at the same distance therebetween as those in the printed-side openings 120. Hence, when the flexible circuit board 200 is overlapped with the printed circuit board 100, the both openings 120 and 220 align with each other.

Dimensions between the individual flexible-side conductive patterns 210 and the like are set equal to those between the individual printed-side conductive patterns 110. As such, only one flexible-side conductive pattern 210 is brought into contact with one printed-side conductive pattern 110. The flexible-side conductive patterns 210 are exposed at the end portion, whereas other portions thereof are covered by an insulative film (not shown) in order to avoid unnecessary short-circuit.

Figure 5:
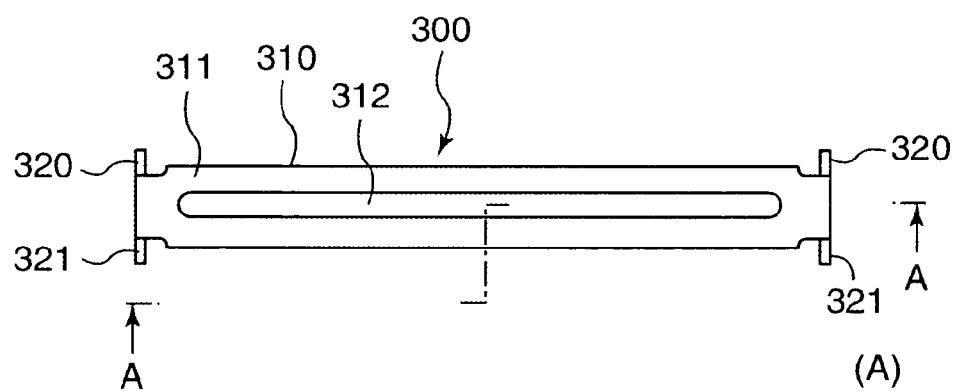
Figure 5:
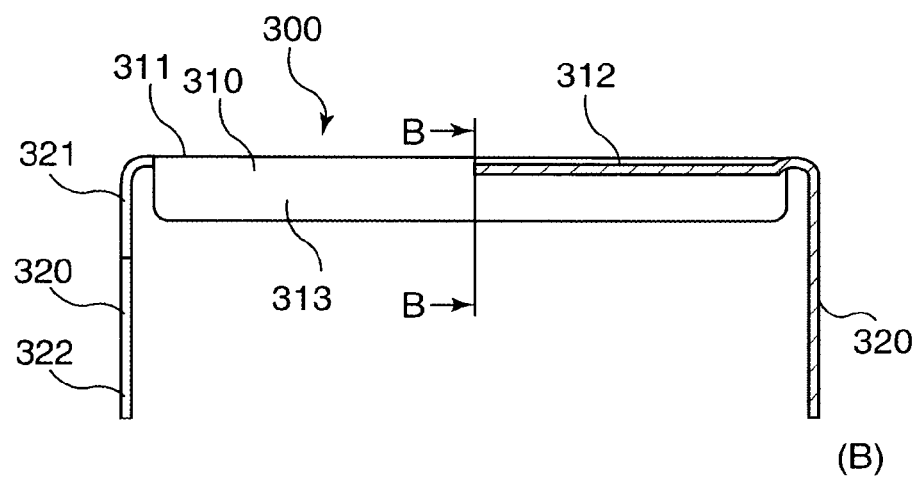
Figure 5:
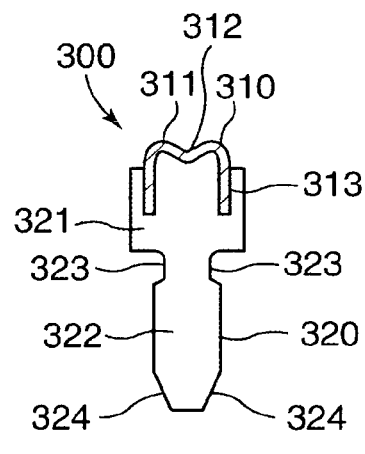
Figure 5:
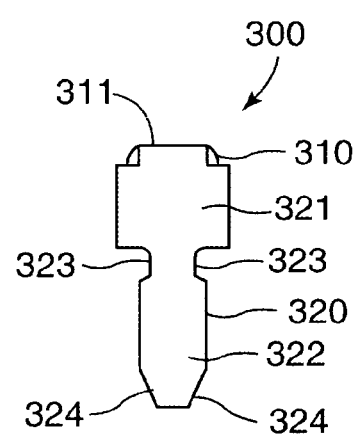

As shown in FIG. 5, the frame 300 has a configuration in that that a substantially inverted bucket-shaped holding part 310 into which the elastic pressing member 400 is put and a pair of leg parts 320 protruding downwardly from two side faces of the holding part 310 are integrally formed. The holding part 310 is formed to have the substantially inverted bucket-shape, in which a protrusion 312 having a downward-convex shape almost throughout the overall length of the holding part 310 is formed on a top face 311. The height of each sidewall 313 of the holding part 310 is set slightly less than the height of a side face 321 of each of the leg parts 320.

The leg part 320 has a substantially rectangular side face 321 that is slightly wider than the width of the side face of the holding part 310 and a tongue-like piece 322 extending down from a lower end portion of the side face 321. The tongue-like piece 322 is set to have a width that is narrower than that of the side face 321 and that is almost the same as the width of the holding part 310 (see FIGS. 5C and 5D). Notches 323 are formed from the left and right sides of the base end of the tongue-like piece 322 to make the remaining portion narrower than other portions, and tapered portions 324 are formed on the left and right sides of the end of the tongue-like piece to ease the insertion. The notches 323 are used to fix the leg parts 320 by performing twisting processing on the bottom surface of the printed circuit board 100, and the height thereof is set slightly larger than the sum of the thickness of the printed circuit board 100 and the thickness of the flexible circuit board 200.

The elastic pressing member 400 is a substantially lengthy rectangular parallelepiped member that is formed of insulative rubber or the like, and the width thereof is set slightly larger than that of the holding part 310 of the frame 300. Accordingly, the elastic pressing member 400 is put into the frame 300. In the elastic pressing member 400, a lower surface 410 brought into contact with the flexible circuit board 100 and an upper surface 420 brought into contact with the rear surface of the top face 311 of the holding member 310 of the frame 300 are formed to be flat.

The connection structure between a printed circuit board and a flexible circuit board, which is constituted of the members described above, connects the printed circuit board 100 with the flexible circuit board 200 in the following manner.

The flexible-side conductive patterns 210 formed on the flexible circuit board 200 is overlapped with the printed-side conductive patterns 110 formed on the printed circuit board 100 to implement electrical conduction therebetween. In this case, the printed-side openings 120 of the printed circuit board 100 are aligned with the flexible-side openings 220 of the flexible circuit board 200, thereby implementing normal conduction between the printed-side conductive patterns 110 and the corresponding flexible-side conductive patterns 210.

The leg parts 320 of the frame 300 wherein the elastic pressing member 400 is put into the holding part 310 are inserted through the aligned flexible-side openings 220 and printed-side openings 120. As a result, lower end portions of the side faces 321 of the frame 300 are brought into contact with the flexible circuit board 200, and the insertion of the leg parts 320 are stopped in that position. Accordingly, a gap G is formed between the sidewall 313 of the holding part 310 of the frame 300 and the flexible circuit board 200 (see FIG. 2).

Subsequently, the leg parts 320 are each twisted from the portion of the notches 323 (see an arrow A in FIG. 2). Specifically, the leg parts 320 are each twisted on the noninsertion side surface of the printed circuit board 100, whereby the frame 300 is fixed to the printed circuit board 100. Accordingly, the elastic pressing member 400 put into the holding part 310 of the frame 300 presses the flexible circuit board 200 and the printed circuit board 100. Consequently, reliable conduction between the printed-side conductive patterns 110 and the flexible-side conductive patterns 210 can be secured.

In particular, since the downwardly-convex protrusion 312 is provided to the top face 311 of the frame 300, the elastic pressing member 400 is pressed by the protrusion 312 to the lower side, that is, to the flexible circuit board 200 side. Thereby, the electrical connection between the flexible-side conductive patterns 210 and the printed-side conductive patterns 110 is secured. Further, since the gap G is formed between the sidewall 313 of the frame 300 and the flexible circuit board 200, the pressing force applied from the frame 300 to the elastic pressing member 400 is securely transferred to the flexible circuit board 200.

In the connection structure between a printed circuit board and a flexible circuit board according to the first embodiment, the elastic pressing member 400 has a configuration in that the lower surface 410 brought into contact with the flexible circuit board 200 and the upper surface 420 brought into contact with the rear surface of the top face 311 of the holding member 310 of the frame 300 are formed to be flat. However, as shown in FIG. 6, the lower surface 410 brought into contact with the flexible circuit board 200 may be protruded substantially in the form of the letter U (second embodiment).

When the lower surface 410 of the elastic pressing member 400 is formed to protrude substantially in the U shape, the pressing force can be transferred from the elastic pressing member 400 to the flexible circuit board 200 more concentrically than the lower surface 410 formed to be flat. This enables securing more reliable conduction between the printed-side conductive patterns 110 and the flexible-side conductive patterns 210.

Further, as shown in FIG. 7, the elastic pressing member 400 may have a configuration in that not only the lower surface 410 but also the upper surface 420, that is, the side brought into contact with the rear surface of the top face 311 of the holding part 310 of the frame 300 may be formed to protrude substantially in a U shape (third embodiment). When the upper surface 420 of the elastic pressing member 400 is also formed to protrude substantially in the U shape, the pressing force can be more concentrically transferred from the elastic pressing member 400 to the flexible circuit board 20. This enables securing more reliable conduction between the printed-side conductive patterns 110 and the flexible-side conductive patterns 210.

Also in the second embodiment and the third embodiment, similarly to the first embodiment, the gap G is formed between the frame 300 and the flexible circuit board 200 in the state where the leg parts 320 of the frame 300 are inserted into the flexible-side openings 220 of the flexible circuit board 200 and the printed-side openings 120 of the printed circuit board 100.

Further, also in the second embodiment and the third embodiment, similarly to the first embodiment, the downwardly-convex protrusion 312 is provided to the top face 311 of the holding part 310 of the frame 300.

The connection structure between a printed circuit board and a flexible circuit board according to the present invention is a connection structure between a printed circuit board and a flexible circuit board, for connecting printed-side conductive patterns formed on a printed circuit board with flexible-side conductive patterns formed on a flexible circuit board, the connection structure comprising: two or more printed-side openings provided around the printed-side conductive patterns of the printed circuit board; two or more flexible-side openings provided in the flexible circuit board to align with the printed-side openings when the flexible-side conductive patterns are brought into contact with the printed-side conductive patterns; a frame having two or more leg parts that are inserted through the both openings; and an insulative elastic pressing member interposed between the frame and the flexible circuit board, wherein the leg parts are fixed on a bottom surface of the printed circuit board.

Accordingly, in the connection structure between a printed circuit board and a flexible circuit board, since the leg parts of the frame are inserted through the printed circuit board and the flexible circuit board, screw-fixing which has been conventionally employed is not necessary. Consequently, the problem of detachment of the flexible circuit board is not caused. Further, since a connector is not used, steps of soldering, for example, the connector to the printed circuit board can be reduced.

The elastic pressing member has an advantage in that when the elastic pressing member is put into the frame, in the case where the leg parts of the frame are inserted into and penetrate through the flexible-side openings and the printed-side openings, the elastic member is not detached from the frame and, also, has an advantage in that there is no necessity of working such that the elastic pressing member is bonded in the frame.

With the elastic pressing member having the protruded side that is brought into contact with the flexible circuit board, the pressing force of the elastic pressing member to the flexible circuit board can be concentrically transferred thereto. Consequently, this enables securing more reliable conduction between the printed-side conductive patterns and the flexible-side conductive patterns.

The elastic pressing member has the protruded side that is brought into contact with the flexible circuit board and the protruded side that is brought into contact has with the frame, so that the pressing force can be more concentrically transferred to the flexible circuit board of the elastic pressing member. This enables securing more reliable conduction between the printed-side conductive patterns and the flexible-side conductive patterns.

The protrusion is provided to the frame to press the elastic pressing member put into the frame to the flexible circuit board side, so that when the elastic pressing member is put into the frame, the frame itself presses the elastic pressing member to the flexible circuit board side. This secures the electrical connection between the flexible-side conductive patterns and the printed-side conductive patterns.

The gap is formed between the frame and the flexible circuit board in the state where the leg parts of the frame are inserted into the flexible-side openings of the flexible circuit board and the printed-side openings of the printed circuit board, so that the pressing force applied from the frame to the elastic pressing member is securely transferred to the flexible circuit board. If the gap is not provided, spacing for the elastic pressing member to deform is not present. Accordingly, an excessive pressing force is applied to the flexible circuit board, potentially leading to warpage of the flexible circuit board. However, the provision of the gap provides an advantage in that such problems are not caused.

What is claimed is:

1. A connection structure between a printed circuit board and a flexible circuit board, for connecting printed-side conductive patterns formed on a printed circuit board with flexible-side conductive patterns formed on a flexible circuit board, the connection structure comprising:
   two or more printed-side openings provided around the printed-side conductive patterns of the printed circuit board;
   two or more flexible-side openings provided in the flexible circuit board to align with the printed-side openings when the flexible-side conductive patterns are brought into contact with the printed-side conductive patterns;
   a frame having two or more leg parts that are inserted through the both openings; and
   an insulative elastic pressing member interposed between the frame and the flexible circuit board, wherein the leg parts having a side face and a tongue piece with a notch therebetween, and the leg parts are fixed on a bottom surface of the printed circuit board by twisting the tongue parts about the notch.

2. The connection structure between a printed circuit board and a flexible circuit board according to claim 1, wherein the elastic pressing member is put into the frame.

3. The connection structure between a printed circuit board and a flexible circuit board according to claim 2, wherein
   the frame is provided with a protrusion that presses the elastic pressing member put into the frame to the flexible circuit board side.

4. The connection structure between a printed circuit board and a flexible circuit board according to claim 3, wherein
   a gap is formed between the frame and the flexible circuit board in the state where the leg parts of the frame are inserted into the flexible-side openings of the flexible circuit board and the printed-side openings of the printed circuit board.

5. The connection structure between a printed circuit board and a flexible circuit board according to claim 2, wherein
   a gap is formed between the frame and the flexible circuit board in the state where the leg parts of the frame are inserted into the flexible-side openings of the flexible circuit board and the printed-side openings of the printed circuit board.

6. The connection structure between a printed circuit board and a flexible circuit board according to claim 2, wherein
   the elastic pressing member protrudes on a side brought into contact with the flexible circuit board.

7. The connection structure between a printed circuit board and a flexible circuit board according to claim 2, wherein
   the elastic pressing member protrudes on the side brought into contact with the flexible circuit board and a side brought into contact with the frame.

8. The connection structure between a printed circuit board and a flexible circuit board according to claim 1, wherein
   the elastic pressing member protrudes on a side brought into contact with the flexible circuit board.

9. The connection structure between a printed circuit board and a flexible circuit board according to claim 8, wherein
   the frame is provided with a protrusion that presses the elastic pressing member put into the frame to the flexible circuit board side.

10. The connection structure between a printed circuit board and a flexible circuit board according to claim 8, wherein
    a gap is formed between the frame and the flexible circuit board in the state where the leg parts of the frame are inserted into the flexible-side openings of the flexible circuit board and the printed-side openings of the printed circuit board.

11. The connection structure between a printed circuit board and a flexible circuit board according to claim 1, wherein
    the elastic pressing member protrudes on the side brought into contact with the flexible circuit board and a side brought into contact with the frame.

12. The connection structure between a printed circuit board and a flexible circuit board according to claim 11, wherein
    the frame is provided with a protrusion that presses the elastic pressing member put into the frame to the flexible circuit board side.

13. The connection structure between a printed circuit board and a flexible circuit board according to claim 11, wherein
    a gap is formed between the frame and the flexible circuit board in the state where the leg parts of the frame are inserted into the flexible-side openings of the flexible circuit board and the printed-side openings of the printed circuit board.

* * * * *